United States Patent
Ongchin et al.

(10) Patent No.: US 8,143,721 B2
(45) Date of Patent: Mar. 27, 2012

(54) PACKAGE SUBSTRATE DYNAMIC PRESSURE STRUCTURE

(75) Inventors: Stewart M. Ongchin, Phoenix, AZ (US); King Gonzalez, Gilbert, AZ (US); Vadim Sherman, Scottsdale, AZ (US); Stephen Tisdale, Gilbert, AZ (US); Xiaoqing Ma, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/771,990

(22) Filed: Jun. 29, 2007

(65) Prior Publication Data

US 2009/0001564 A1    Jan. 1, 2009

(51) Int. Cl.
    *H01L 23/06* (2006.01)
(52) U.S. Cl. .................. 257/729; 257/619
(58) Field of Classification Search .......... 257/620, 257/623, 619, 729, E23.191; 438/118
    See application file for complete search history.

(56) References Cited

U.S. PATENT DOCUMENTS

| | | | | |
|---|---|---|---|---|
| 3,602,634 A * | 8/1971 | Meuli | | 174/539 |
| 4,675,472 A * | 6/1987 | Krumme et al. | | 174/561 |
| 6,149,742 A * | 11/2000 | Carpenter et al. | | 148/563 |
| 6,153,924 A * | 11/2000 | Kinsman | | 257/666 |
| 6,292,362 B1 * | 9/2001 | O'Neal et al. | | 361/679.54 |
| 6,313,521 B1 * | 11/2001 | Baba | | 257/678 |
| 6,821,823 B2 * | 11/2004 | Xie et al. | | 438/127 |
| 6,825,556 B2 * | 11/2004 | Joshi et al. | | 257/707 |
| 6,875,931 B2 | 4/2005 | Combs et al. | | 174/262 |
| 6,903,278 B2 | 6/2005 | Sathe | | 174/255 |
| 7,372,133 B2 | 5/2008 | Shojaie et al. | | 257/676 |
| 7,772,682 B1 * | 8/2010 | Zhang et al. | | 257/684 |
| 2002/0121705 A1 * | 9/2002 | Pu et al. | | 257/778 |
| 2005/0073035 A1 * | 4/2005 | Moxham | | 257/678 |
| 2007/0228531 A1 | 10/2007 | Ma et al. | | 257/678 |

FOREIGN PATENT DOCUMENTS

| | | |
|---|---|---|
| JP | 2006-294659 | * 10/2006 |
| JP | 32006294659 | * 10/2006 |
| WO | WO2005104230 | * 11/2005 |

* cited by examiner

*Primary Examiner* — Steven Loke
*Assistant Examiner* — Kimberly M Thomas
(74) *Attorney, Agent, or Firm* — Konrad Raynes & Victor LLP; Alan S. Raynes

(57) ABSTRACT

Devices and methods for their formation, including electronic assemblies having a shape memory material structure, are described. In one embodiment, a device includes a package substrate and an electronic component coupled to the package substrate. The device also includes a shape memory material structure coupled to the package substrate. In one aspect of certain embodiments, the shape memory material structure is formed from a material selected to have a martensite to austenite transition temperature in the range of 50-300 degrees Celsius. In another aspect of certain embodiments, the shape memory material structure is positioned to extend around a periphery of the electronic component. Other embodiments are described and claimed.

21 Claims, 4 Drawing Sheets

PACKAGE SUBSTRATE DYNAMIC PRESSURE STRUCTURE

RELATED ART

Integrated circuits may be formed on semiconductor wafers made from materials such as silicon. The semiconductor wafers are processed to form various electronic devices. The wafers are diced into semiconductor chips (a chip is also known as a die), which may then be attached to a package substrate using a variety of known methods. In one known method for attaching a chip or die to a package substrate, the die may have solder bump contacts which are electrically coupled to the integrated circuit. The solder bump contacts extend onto the contact pads of a package substrate, and are typically attached in a thermal reflow process. Electronic signals may be provided through the solder bump contacts to and from the integrated circuit on the die.

The material of package substrate typically does not provide an exact match with the material of the die with respect to the coefficient of thermal expansion. Thermal expansion mismatch can lead to stresses developing in the electronic assembly during processing procedures, in particular, during heating and cooling operations such as solder reflow. Such stresses may cause warpage in the package substrate. As electronic devices and package substrates become more thin, warpage will continue to be a problem.

Package substrate warpage problems may be addressed using a number of approaches. For example, a thicker substrate may be used. The thicker substrate is more rigid due to its thickness and thus less likely to undergo substantial warpage. Another approach is to use a heat spreader coupled to the die and the substrate. The heat spreader also makes the assembly more rigid and less prone to warpage. Still another approach is to use a stiffener coupled to the package substrate. The stiffener may take the form of a metal ring coupled to the package substrate. The metal ring adds mass to the assembly and makes it more rigid and less prone to warpage. All of these methods add substantial mass and thickness to the package substrate assembly.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to electronic assemblies. Embodiments include both devices and methods for forming electronic assemblies.

Figure 1:
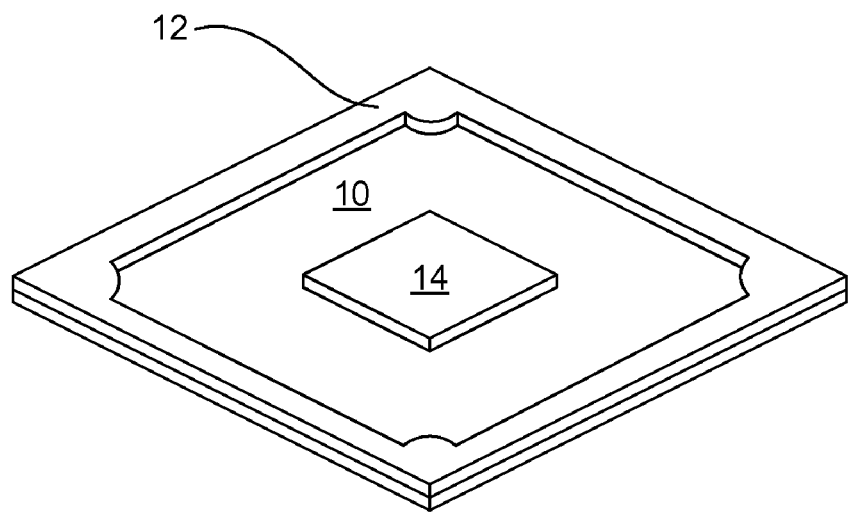
FIG. 1 illustrates a shape memory material structure on a package substrate, in accordance with certain embodiments.

FIG. 1 illustrates an electronic assembly in accordance with certain embodiments. The electronic assembly includes a package substrate 10 having a shape memory material structure 12 and an electronic component such as a die 14 positioned thereon. The package substrate may be a single layer or multilayer, and may be formed from any suitable material, including, but not limited to, ceramics, polymers, and composite structures. One example of a suitable package substrate material is an epoxy resin. As illustrated in the embodiment of FIG. 1, the die 14 may be positioned on a central region of the package substrate 10. The shape memory material structure 12 may encircle the die 14 and be positioned on an outer portion of the package substrate 10.

One example of a shape memory material composition includes an alloy including nickel-titanium and is sold under the trade name NITINOL. Shape memory materials, such as certain alloys, have the unique property of regaining their original shape through a phase transformation below the melting point. In the case of most alloys, the original shape is set at a high temperature while in the austenite crystal phase. Upon cooling, the crystal phase changes to martensite. Any changes to the shape of the material will be reset to the original shape during the crystal structure transformation from martensite to austenite. This transformation imparts a force on the material. For example, a shape memory material that has experienced a strain in the martensitic phase, upon heating, may undergo a phase change to a more ordered austenitic crystal phase. This phase change causes the material to recover its strain and is capable of imparting large forces. One specific example, NITINOL H (a high temperature range NITINOL) has an austenite transition temperature of 100 degrees Celsius, and may be used in certain embodiments. Certain embodiments utilize a shape memory material structure formed from a material having a martensite to austenite transformation temperature in the range of about 50 to about 300 degrees Celsius. Shape memory materials may include, but are not necessarily limited to, metal alloys having suitable phase transformation properties.

The use of a shape memory material structure enables an active force to be applied to counteract the package warpage forces during reflow temperatures so that the package substrate assembly can remain substantially flat. Conventional approaches provide a passive control to inhibit warpage, whereas the use of a shape memory material structure provides an active control, during the processing operations that generate warpage forces, to inhibit warpage. The use of the active force applied by the shape memory material enables certain embodiments to be formed thinner than conventional stiffeners, while providing the same or a greater level or force to resist warpage (the conventional stiffener applies a passive force after the package substrate begins to warp). As a result, certain embodiments are well suited to being used in applications where limiting thickness is essential, for example, in package assemblies for mobile applications.

In certain embodiments, the shape memory material structure 12 may be formed and the original shape may be set at around 500 degrees Celsius, in the austenite crystalline phase. The shape memory material structure 12 may in certain embodiments be formed to have a zero or near zero warpage.

The structure 12 may then be coupled to the package substrate as will be described below in connection with FIG. 2. When the package substrate is exposed to elevated temperatures and starts to warp (for example, during a reflow process), the shape memory material structure 12 produces a counter force to the warpage because the elevated temperature is changing the crystal structure from a martensitic crystal structure to an austenitic crystal structure. This change in crystal structure applies an active force that suppresses the package substrate's tendency to warp during elevated temperature processes.

Figure 2A:
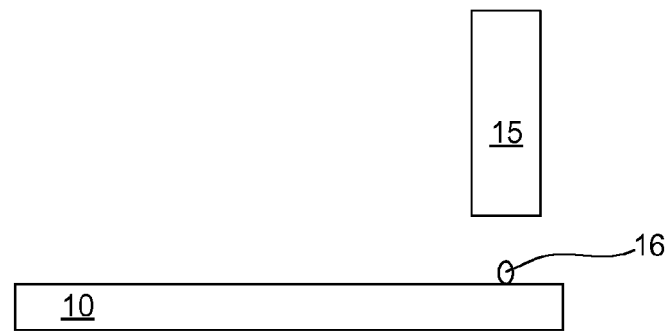
FIGS. 2(A)-2(C) illustrate processing operations for coupling a shape memory material structure to a package substrate, in accordance with certain embodiments.
Figure 2B:
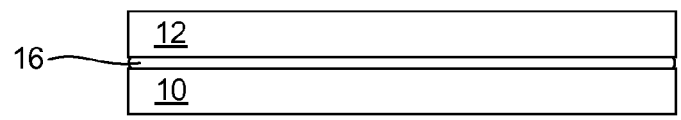
Figure 2C:
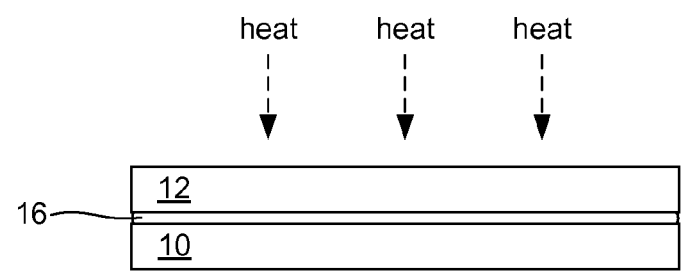

FIGS. 2(A)-2(C) illustrate coupling the shape memory material structure 12 to the package substrate 10, in accordance with certain embodiments. The shape memory material structure 12 may be coupled to the package substrate using any suitable approach. As seen in FIG. 2(A), for example, an adhesive 16 is applied to the package substrate 10 through an applicator 15. A variety of adhesives may be used, including, but not limited to, an epoxy adhesive. The adhesive 16 is positioned on the surface of the package substrate 10, and then the shape memory material structure 12 is positioned thereon, as illustrated in FIG. 2(B).

Depending on the adhesive used, a heating operation may be carried out, as indicated in FIG. 2(C), to cure the adhesive 16 to form a suitable bond between the shape memory material structure 12 and the package substrate 10. While FIG. 2(A) illustrates the use of a liquid adhesive that is applied to the package substrate, other approaches, for example, a solid, preformed adhesive that is heated after the shape memory material structure is positioned on the substrate, may also be used in certain embodiments. In an alternative embodiment, the shape memory material structure 12 may be deposited directly onto the package substrate 10, with no separate adhesive layer formed therebetween.

In certain embodiments, after the shape memory material structure 12 has been coupled to the package substrate 10, an electronic device such as the semiconductor die 14 is coupled to the package substrate 10 using a suitable method, for example, a solder bump method.

The shape memory material structure may in certain embodiments have a ring-like structure. By ring-like, it is meant that the structure is formed to extend around (or define) a hole or open region. In FIG. 1, the shape memory material structure 12 defines a hole bounded by the four sides (and curved corner regions) of the shape memory material structure 12. The die 14 is positioned within a portion of the hole bounded by the sides of the shape memory material structure 12. The embodiments illustrated in FIGS. 1, 3, and 4 are all examples of ring-like structures.

Figure 3:
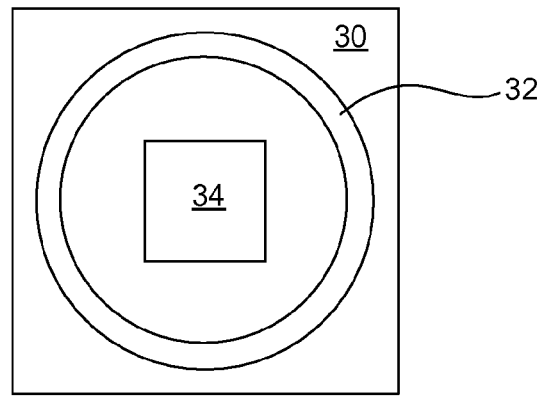
FIG. 3 illustrates a top view of a shape memory material structure on a package substrate, in accordance with certain embodiments.
Figure 4:
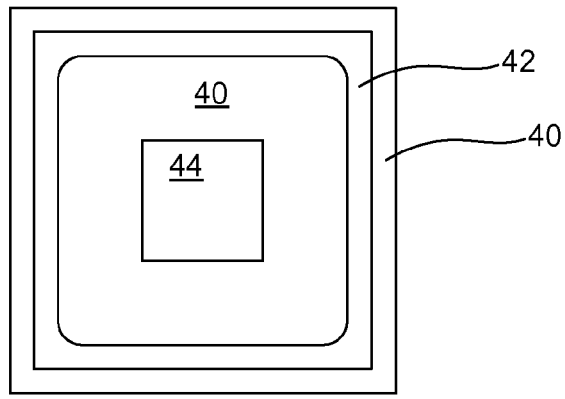
FIG. 4 illustrates a top view of a shape memory material structure on a package substrate, in accordance with certain embodiments.

FIGS. 3, 4, and 5(A)-5(C) illustrate additional examples of shapes and positions of shape memory material structures on package substrates. In FIG. 3, the shape memory material structure 32 positioned on the package substrate 30 has a structure that is substantially circular when viewed from above. In FIG. 4, the shape memory material structure 42 on the package substrate 40 has a structure that is substantially rectangular in structure, with rounded interior corners. The shape memory material structures 32, 42 of FIGS. 3 and 4 are positioned a distance away from the side edges of the package substrates 30, 40, unlike the shape memory material structure 12 of FIG. 1, which is aligned with the side edges of the package substrate 10.

Figure 5A:
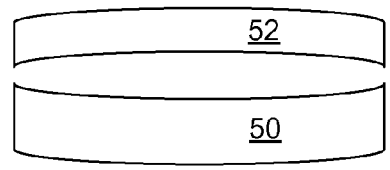
FIGS. 5(A)-5(C) illustrate processing operations for coupling a shape memory material structure to a substrate and the resultant assembly after heating, in accordance with certain embodiments.
Figure 5B:
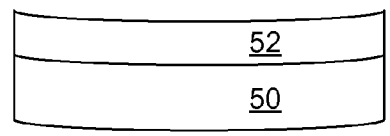
Figure 5C:
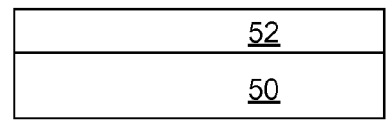

FIGS. 5(A)-5(C) illustrate the application of a shape memory material structure 52 to a substrate 50 and the resultant assembly after heating, in accordance with another embodiment. In this embodiment, the shape memory structure 52 is formed to have a curvature that opposes that of the substrate 50 to which it is attached. As illustrated in FIG. 5(A), the shape memory structure 52 has a curvature that is opposite the curvature of the substrate 50. FIG. 5(B), the shape memory material structure 52 is coupled to the package substrate 50 and has a concave shape due to the forces applied by the substrate 50. FIG. 5(C) illustrates the shape memory material structure 52 and substrate 50 after heating, where the heating has caused a phase change in the shape memory material structure 52, which applied a force to counteract the force in the substrate 50 and caused the assembly to flatten. Thus, the use of a concave or otherwise bowed shape material structure may also be used in certain embodiments to provide additional force to counteract warpage forces developed during processing operations.

Figure 6:
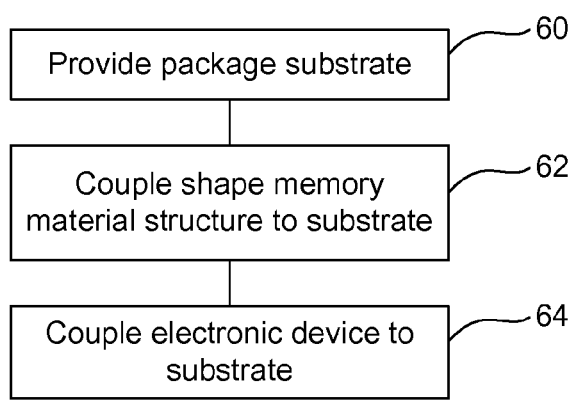
FIG. 6 illustrates a flow chart of certain operations for forming an assembly, in accordance with certain embodiments.

FIG. 6 illustrates a flow chart of certain operations for forming an assembly in accordance with certain embodiments. Box 60 is providing a package substrate to which a shape memory material structure and an electronic device will be coupled. Box 62 is coupling the shape memory material structure to the substrate, using a technique such as described above. Box 64 is coupling an electronic device such as a semiconductor die to the substrate, to form an assembly.

Assemblies as described in embodiments above may find application in a variety of electronic components. In certain embodiments, a device or devices in accordance with the present description may be embodied in a computer system including a video controller to render information to display on a monitor coupled to the computer. The computer system may comprise one or more of a desktop, workstation, server, mainframe, laptop, handheld computer, handheld gaming device, handheld entertainment device (for example, a video player), PDA (personal digital assistant), telephony device (wireless or wired), etc. Alternatively, a device or devices in accordance with the present description may be embodied in a computing device that does not include a video controller, such as a switch, router, etc.

Figure 7:
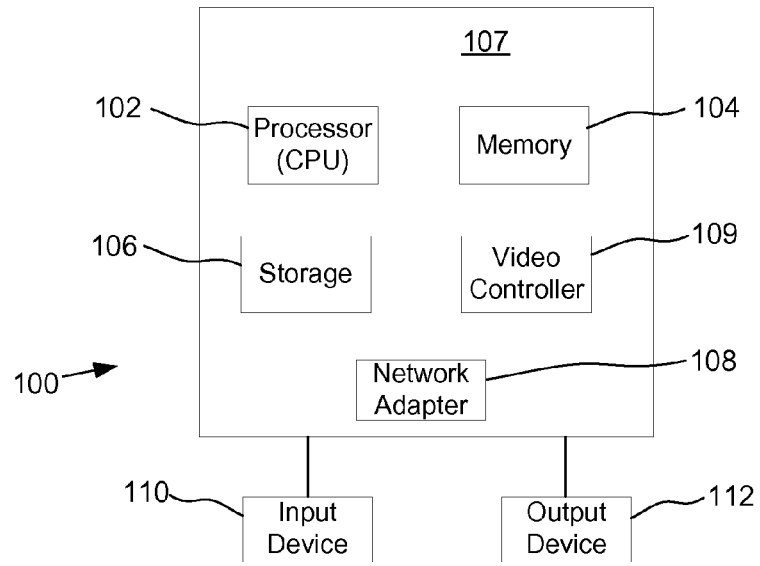
FIG. 7 illustrates an electronic system arrangement in which certain embodiments may find application.

FIG. 7 schematically illustrates one example of an electronic system environment in which aspects of described embodiments may be embodied. Other embodiments need not include all of the features specified in FIG. 7, and may include alternative features not specified in FIG. 7. FIG. 7 illustrates an embodiment of a device including a computer architecture 100. The architecture 100 may include a CPU 102, memory 104 (including, for example, a volatile memory device), and storage 106 (including, for example, a non-volatile storage device, such as magnetic disk drives, optical disk drives, etc.). The CPU 102 may be coupled to a printed circuit board 107, which in this embodiment, may be a motherboard. The CPU 102 is an example of a package substrate assembly formed in accordance with the embodiments described above and illustrated, for example, in FIG. 1. A variety of other system components, including, but not limited to input/output devices, controllers, memory and other components, may also include structures formed in accordance with the embodiments described above. The system components may be formed on the motherboard, or may be disposed on other cards such as daughter cards or expansion cards.

The storage 106 may comprise an internal storage device or an attached or network accessible storage. Programs in the storage 106 may be loaded into the memory 104 and executed by the CPU 102 in a manner known in the art. The architecture may further include a network controller 108 to enable communication with a network, such as an Ethernet, a Fibre Channel Arbitrated Loop, etc. Further, the architecture may, in certain embodiments, also include a video controller 109, to render information on a display monitor, where the video controller may be embodied on a video card or integrated on integrated circuit components mounted on the motherboard, for example. Other controllers may also be present to control other devices.

An input device 110 may be used to provide input to the CPU 102, and may include, for example, a keyboard, mouse, pen-stylus, microphone, touch sensitive display screen, or any other suitable activation or input mechanism. An output device 112 including, for example, a monitor, printer, speaker, etc., capable of rendering information transmitted from the CPU 102 or other component, may also be present.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A device comprising:
    a package substrate having a first surface;
    an electronic component positioned on the first surface of the package substrate;
    a shape memory material structure positioned on the first surface of the package substrate, wherein the shape memory material structure comprises a material that undergoes a phase transformation below the melting point of the material, and wherein the phase transformation takes place in a temperature range of 50 degrees Celsius to 300 degrees Celsius; and
    an adhesive material positioned between the package substrate and the shape memory material structure.

2. The device of claim 1, wherein the shape memory material structure comprises nickel and titanium.

3. The device of claim 1, wherein the shape memory material structure comprises a material having a martensite to austenite transition temperature in the range of 50-300 degrees Celsius.

4. The device of claim 1, wherein the shape memory material structure is positioned to extend around a periphery of the electronic component.

5. The device of claim 1, wherein the package substrate includes a plurality of side surfaces, and the shape memory material structure is positioned to extend to the plurality of side surfaces of the package substrate.

6. The device of claim 1, wherein the shape memory material structure is a one-piece structure having a ring-like shape.

7. The device of claim 1, wherein the device comprises a computer system including:
    a central processing unit;
    a memory electronically coupled to the central processing unit;
    an input device electronically coupled to the central processing unit;
    an output device electronically coupled to the central processing unit; and
    a video controller electronically coupled to the central processing unit.

8. A device comprising:
    an electronic component positioned on a package substrate; and
    a shape memory material structure positioned on the package substrate;
    wherein the electronic component and the shape memory material structure are positioned on the same surface of the package substrate; and
    wherein the shape memory material structure comprises an alloy that undergoes a phase transformation when heated to a temperature below the melting point of the alloy, and wherein the phase transformation causes a force to be applied from the shape memory material structure to the package substrate to inhibit warping of the package substrate.

9. The device of claim 8, wherein the phase transformation occurs in the range of about 50 degrees Celsius to about 300 degrees Celsius.

10. The device of claim 8, wherein the shape memory material structure comprises nickel and titanium.

11. A device comprising:
    an electronic component coupled to a package substrate; and
    a shape memory material structure coupled to the package substrate;
    wherein the electronic component and the shape memory material structure are coupled to the same surface of the package substrate;
    wherein the shape memory material structure comprises an alloy that undergoes a phase transformation when heated to a temperature below the melting point of the alloy, and wherein the phase transformation causes a force to be applied from the shape memory material structure to the package substrate to inhibit warping of the package substrate; and
    wherein the shape memory material structure is positioned to extend around a periphery of the electronic component, wherein the shape memory material structure includes interior side regions facing the electronic component, wherein the shape memory material structure also includes interior corner regions between the interior side regions, the interior side regions being straight and the interior corner regions being curved, wherein the interior corner regions are curved to extend towards the electronic component.

12. The device of claim 8, wherein the shape memory material structure is coupled to a first surface of the package substrate, the first surface including four edges, and wherein the shape memory material structure extends to the four edges of the first surface.

13. The device of claim 8, wherein the electronic component comprises a central processing unit.

14. The device of claim 8, wherein the shape memory material structure is coupled to the package substrate through an adhesive layer positioned in direct contact with the surface the electronic component is positioned on, wherein the shape memory material structure is separated from the surface the electronic component is positioned on by only the adhesive layer.

15. A device comprising:
    a package substrate;
    an electronic component coupled to the package substrate;
    a shape memory material structure coupled to the package substrate, wherein the shape memory material structure comprises a material that undergoes a phase transformation below the melting point of the material, and wherein the phase transformation takes place in a temperature range of 50 degrees Celsius to 300 degrees Celsius;
    the package substrate having a structure that displays warpage at the phase transformation temperature; and
    the shape memory material structure being shaped to apply a force to the package substrate that counteracts at least a portion of the warpage in the package substrate after the shape memory material structure reaches the phase transformation temperature.

16. The device of claim 15, wherein the electronic component and the shape memory material structure are positioned on the same surface of the package substrate, and further comprising an adhesive positioned directly between the shape memory material structure and the same surface of the package substrate that the electronic component and the shape memory material structure are positioned on.

17. The device of claim 15, wherein the electronic component and the shape memory material structure are positioned on the same surface of the package substrate, and wherein the shape memory material is in direct contact with the surface of the package substrate.

18. The device of claim 15, wherein the electronic component and the shape memory material structure are positioned on the same surface of the package substrate, and wherein at least a portion of the shape memory material is positioned at an identical distance away from the surface of the package substrate as at least a portion of the electronic component.

19. The device of claim 11, wherein the phase transformation occurs in the range of about 50 degrees Celsius to about 300 degrees Celsius.

20. The device of claim 11, further comprising an adhesive positioned between the package substrate and the shape memory material structure.

21. The device of claim 1, wherein the adhesive material is in direct contact with the first surface of the package substrate.

* * * * *